United States Patent [19]

van Schravendijk et al.

[11] Patent Number: 5,645,625

[45] Date of Patent: *Jul. 8, 1997

[54] DEVICE FOR REMOVING DISSOLVED GAS FROM A LIQUID

[75] Inventors: Bart J. van Schravendijk, Sunnyvale; Christopher W. Burkhart, San Jose; Tito H. Santiago, San Mateo; Charles E. Pomeroy, Santa Clara; Jeffrey W. Lind, Santa Cruz, all of Calif.

[73] Assignee: Novellus Systems, Inc., San Jose, Calif.

[ * ] Notice: The term of this patent shall not extend beyond the expiration date of Pat. No. 5,425,803.

[21] Appl. No.: 394,128

[22] Filed: Feb. 23, 1995

Related U.S. Application Data

[63] Continuation of Ser. No. 270,515, Jul. 5, 1994, Pat. No. 5,425,803, which is a continuation of Ser. No. 978,216, Nov. 16, 1992, abandoned.

[51] Int. Cl.⁶ .................................................. B01D 19/00
[52] U.S. Cl. ........................................................ 95/46; 96/6
[58] Field of Search ............................................ 95/46; 96/6

[56] References Cited

U.S. PATENT DOCUMENTS

| | | | |
|---|---|---|---|
| H1083 | 8/1992 | Meyer et al. | 55/159 X |
| 3,631,654 | 1/1972 | Riely et al. | 55/159 |
| 3,751,879 | 8/1973 | Allington | 55/189 X |
| 4,325,715 | 4/1982 | Bowman et al. | 55/159 X |
| 4,430,098 | 2/1984 | Bowman et al. | 55/191 |
| 4,459,844 | 7/1984 | Burkhart | 73/40.7 |
| 4,469,495 | 9/1984 | Hiraizumi et al. | 55/189 |
| 4,484,936 | 11/1984 | Sakai | 96/6 X |
| 4,869,732 | 9/1989 | Kalfoglou | 55/16 |
| 4,917,776 | 4/1990 | Taylor | 55/159 X |
| 4,986,837 | 1/1991 | Shibata | 55/189 X |
| 4,990,054 | 2/1991 | Janocko | 55/159 X |
| 5,078,755 | 1/1992 | Tozawa et al. | 55/189 X |
| 5,183,486 | 2/1993 | Gatten et al. | 55/159 |
| 5,194,074 | 3/1993 | Hauk | 55/189 X |
| 5,205,844 | 4/1993 | Morikawa | 55/189 X |
| 5,425,803 | 6/1995 | van Schravendijk et al. | 95/46 |

FOREIGN PATENT DOCUMENTS

| | | | |
|---|---|---|---|
| 0434966 | 7/1991 | European Pat. Off. . | |
| 3822093 | 1/1989 | Germany | 95/46 |
| 1-007916 | 1/1989 | Japan | 95/46 |

OTHER PUBLICATIONS

Y. Yagi et al., "Advanced Ultrapure Water Systems with Low Dissolved Oxygen for Native Oxide Free Water Processing", 1992 IEEE, IEEE Transactions on Semiconductor Manufacturing, vol. 5, No. 12, May 1992, pp. 121–127.

Patent Abstracts of Japan, vol. 010 No. 389 (P-531), 26 Dec. 1986 & JPA61176858 (Shimadzu Corp.) 8 Aug. 1986, *abstract*.

Patent Abstracts of Japan, vol. 012 No. 433 (C-543), 15 Nov. 1988 & JPA63158106 (Fuji Photo Film Co Ltd) 1 Jul. 1988 *abstract*.

Primary Examiner—Robert Spitzer
Attorney, Agent, or Firm—Skjerven, Morrill, MacPherson, Franklin & Friel; David F. Steuber; Omkar K. Suryadevara

[57] ABSTRACT

An apparatus and a method for delivering a liquid are disclosed. The liquid contained in a vessel is subjected to a pressurized gas. Any pressurized gas dissolved in the liquid is removed in a degas module by passing the liquid through a gas permeable tube subjected to a pressure differential. Then the liquid is dispensed by a liquid mass flow controller.

29 Claims, 3 Drawing Sheets

DEVICE FOR REMOVING DISSOLVED GAS FROM A LIQUID

This application is a continuation of application serial no. 08/270,515 filed Jul. 5, 1994 (now U.S. Pat. No. 5,425,803), which is a continuation of application serial no. 07/978,216, filed Nov. 16, 1992 (abandoned).

FIELD OF THE INVENTION

This invention relates to liquid delivery systems and, in particular, to an apparatus and method for removing a dissolved gas from a liquid.

BACKGROUND OF THE INVENTION

Plasma enhanced chemical vapor deposition (PECVD) of thin films is one of the most important processes used in the fabrication of very large scale integrated (VLSI) circuits. In this method, gaseous or liquid precursor chemicals are delivered to gas dispersion heads at deposition stations in a reactor chamber, where they react with the silicon substrate. If the chemical is delivered in liquid form, it passes through a vaporizer before it enters the reaction chamber. Systems for delivering chemicals to reactor chambers are a major factor in the operation of PECVD reactors. While delivery systems for gaseous precursor chemicals are well known in the art, systems for delivering liquid precursor chemicals used in PECVD are still under development.

A liquid delivery system for modern PECVD systems must meet two important criteria. First, the liquid must be delivered in a stable manner at a uniform pressure for user specified flow rates. Second, the liquid must be particle-free, gas-free and amenable to precise metering. These criteria are necessary for manufacturing advanced VLSI silicon wafers by PECVD methods. At present, pump based systems suffer from the problem of degradation of dynamic seals over time, which results in addition of unwanted particle impurities to the liquid. Also, pump based liquid delivery systems do not provide consistent delivery at uniform pressure due to the pumping forces involved in the complicated pumping machinery.

Instead of using a pump, the liquid may be supplied from a vessel containing a pressurized gas. However, in this arrangement, some of the gas may dissolve in the liquid. The presence of dissolved gases in the liquid can result in disruption of liquid flow at any downstream point. Whenever low pressure conditions are present, some of the dissolved gas may come out of the liquid in the form of bubbles. Evolution of a gas bubble in the liquid will displace a disproportionately large volume of liquid, thereby leading to inconsistent delivery. Presence of gas bubbles along with the liquid also changes the thermal conductivity of the liquid. Such changes may upset the liquid flow calibration of a liquid mass flow controller, making precise and stable delivery of liquid virtually impossible. Although other controlled orifices could be used instead of liquid mass flow controllers, in these other systems also, the presence of gas bubbles may lead to inaccuracies in metering the liquid flow. This may in turn lead to variations in the thickness and quality of the film being deposited by the PECVD process.

SUMMARY OF THE INVENTION

In a liquid delivery system according to this invention, the liquid is supplied by a supply source using pressurized gas to displace the liquid. The supply source consists of a liquid containing vessel with a gas inlet connected to a source capable of supplying pressurized gas. The supply source vessel also has a liquid outlet connected to a degas module. The degas module removes any dissolved gas from the liquid by passing the liquid through a gas-permeable tube. The degas module consists of a vessel containing a tube whose walls are impermeable to the liquid but permeable to the pressurizing gas. The degas module vessel has an inlet to which one end of the tube is connected and an outlet to which the other end of the tube is connected. Internally, the degas module vessel is maintained at a low pressure by a low pressure connection connected externally to a low pressure source. The inlet of the degas module vessel is connected externally to the liquid outlet of the supply source, and the outlet of the degas module vessel is connected externally to the inlet of a liquid mass flow controller. The liquid mass flow controller is used to dispense the liquid in a stable, precisely metered manner at a uniform pressure at the user specified flow rate.

In a preferred embodiment, the pressurizing gas is helium and the liquid being delivered is tetra-ethyl-ortho-silicate (TEOS). Also, the tube is made of a fluoro-polymer resin, TFE and the degas module is provided with a float device to alarm the user on detection of leakage of the liquid.

DESCRIPTION OF THE INVENTION

Figure 1:
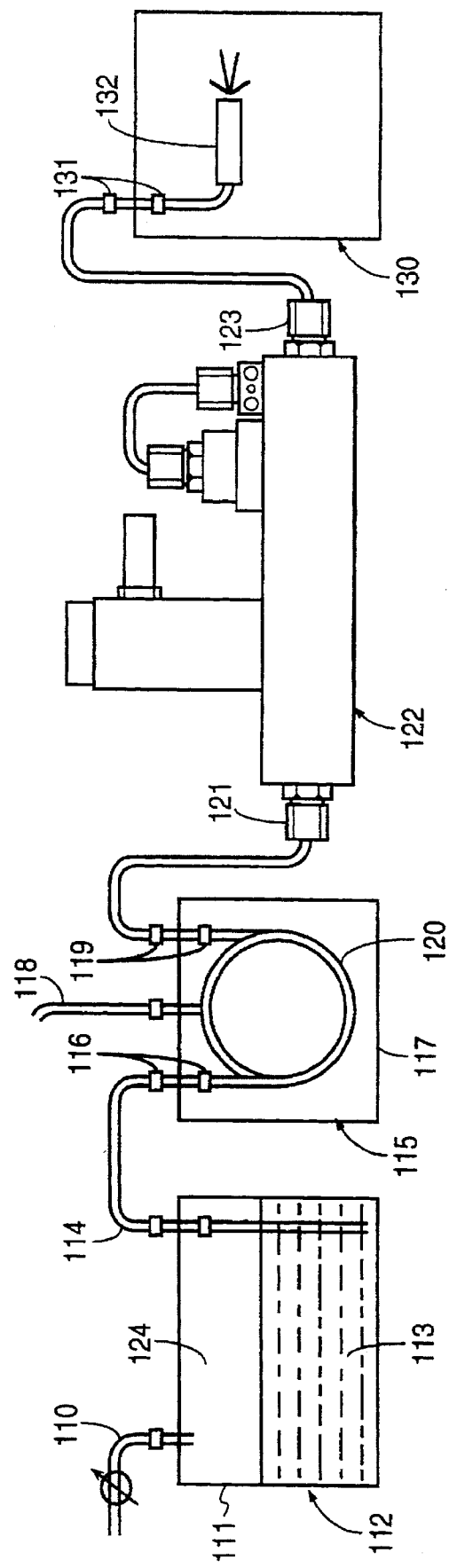
FIG. 1 illustrates the liquid delivery apparatus in accordance with this invention.

As shown in FIG. 1, the liquid delivery system consists of a supply source 112, a degas module 115 and a liquid mass flow controller 122. A liquid 113 is supplied by supply source 112 using a pressurized gas 124 to liquid 113. Supply source 112 includes a vessel 111 with a gas inlet 110 connected to a source capable of supplying pressurized gas (not shown) and a liquid outlet 114 connected to degas module 115. In this embodiment, gas 124 is helium and liquid 113 is tetra-ethyl-ortho-silicate (TEOS). Any other gas and any other liquid that do not chemically interact with each other can be used in place of helium and TEOS. For example, in place of TEOS, other liquids such as tri-methyl-phosphite (TMP) and tri-methyl-borate (TMB) used in PECVD reactors can also be delivered in accordance with this invention.

In supply source 112, depending on the pressure and temperature, a certain amount of helium dissolves in the TEOS. Evolution of helium bubbles in downstream low pressure regions may cause disruption in the TEOS flow and improper metering in the liquid mass flow controller. A degas module 115 removes dissolved helium gas from the TEOS liquid by passing the TEOS liquid through a gas permeable tube 120. Degas module 115 includes a vessel 117 containing tube 120 made of a material impermeable to TEOS but permeable to helium. Degas module 115 is shown in greater detail in FIGS. 2 and 3 (described below). Vessel 117 of degas module 115 has an inlet 116 to which one end of tube 120 is connected and an outlet 119 to which the other end of tube 120 is connected. Vessel 117 also has a low pressure connection 118 connected externally to a low pressure source (not shown). Inlet 116 of vessel 117 is connected externally to liquid outlet 114 of supply source 112. Outlet 119 of vessel 117 is connected externally to an inlet 121 of liquid mass flow controller 122.

Liquid mass flow controller 122 is used to dispense liquid 113 in a precisely metered manner at a uniform pressure at the user specified flow rate. Liquid mass flow controller 122 may be any controller well known in the industry. An outlet 123 of liquid mass flow controller 122 is connected to an inlet 131 of a PECVD reactor 130. A vaporizer 132 resident inside PECVD reactor 130 is connected to inlet 131. After liquid 113 is vaporized it is distributed to gas dispersion heads (not shown).

Figure 3:
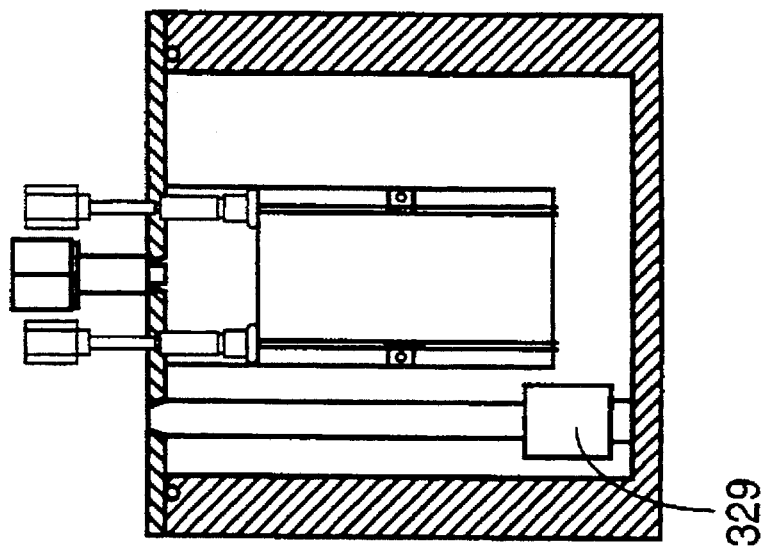
FIG. 3 is another view of the degas module shown in FIG. 2.
Figure 2:
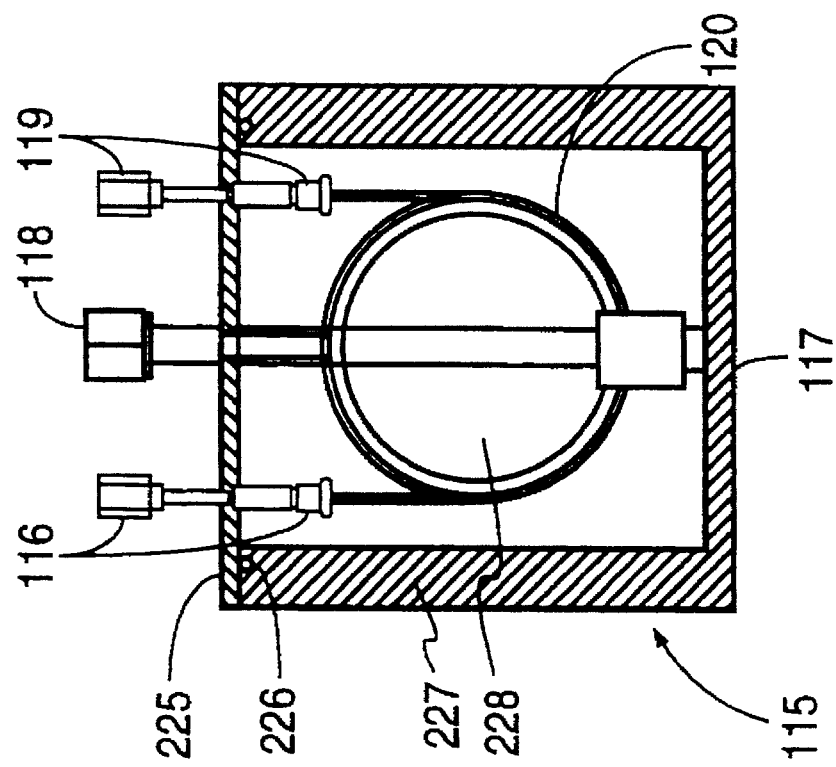
FIG. 2 illustrates the degas module for removing the pressurizing gas dissolved in the liquid.
Figure 4:
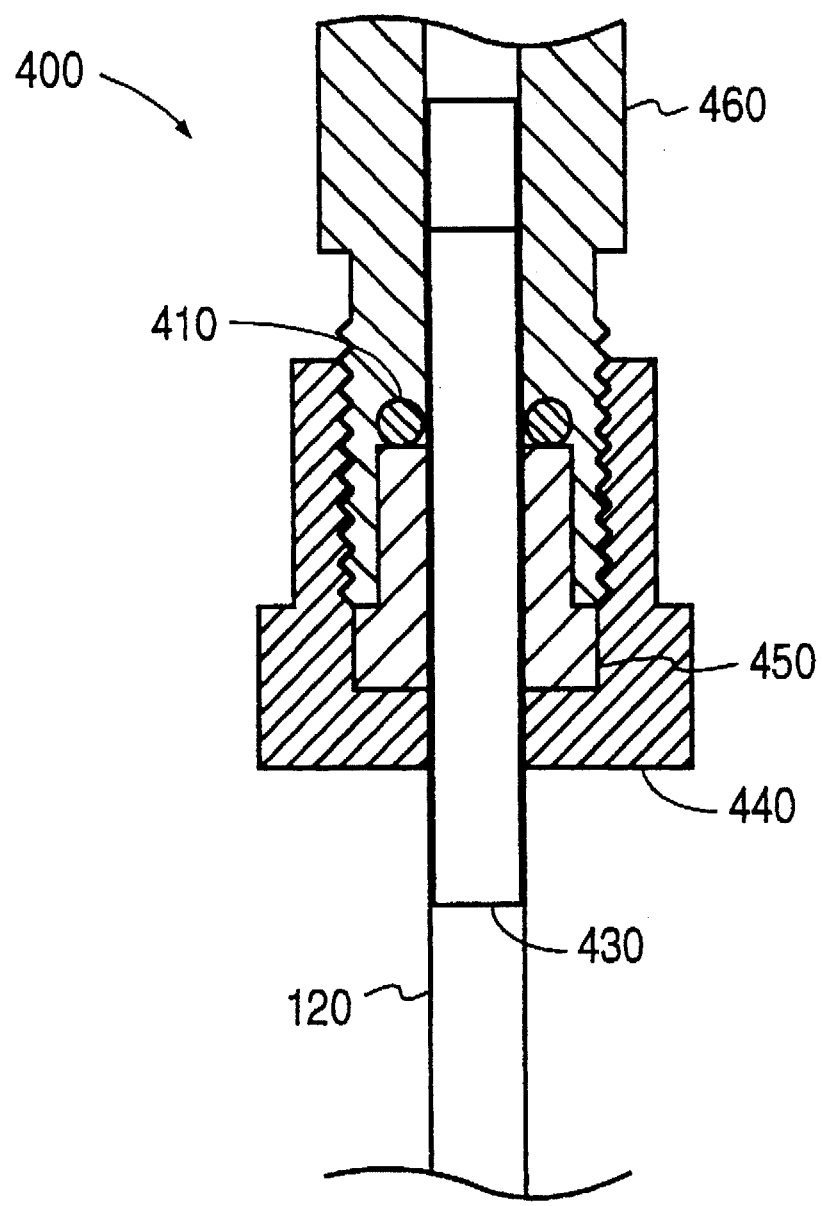
FIG. 4 illustrates the connection of the gas-permeable tube to the inlet and outlet of the degas module.

FIGS. 2 and 3 show in greater detail two side views of the structure of degas module 115. Inlet 116 and outlet 119 of vessel 117 are identical and are of the type illustrated in greater detail in FIG. 4 (described below). In this embodiment, degas module 115 includes a degas module cover 225 covering a degas module base 227. An O-ring 226 is used to form an air-tight seal between the degas module cover 225 and degas module base 227. Tube 120 contained in degas module 115 is coiled around a spool 228 to maximize its length and surface area. Spool 228 also helps prevent any kinks in tube 120. To avoid kinking or twisting, tube 120 is wound carefully by hand, using clean-room gloves and handling material. Also, the axis of spool 228 is kept in a horizontal position so that tube 120 can ride off spool 228 straight up to inlet 116 and outlet 119 of vessel 117. In this particular embodiment, tube 120 made of a fluoro-polymer resin TFE (a trademark of Zeus Corporation, 501 Boulevard, P.O. Box 2167, Orangeburg, S.C. 29116-2167), which is a form of TEFLON. Fluoro-polymer resin material is used for tube 120 due to its chemical inertness and due to its excellent permeability to helium and impermeability to liquids. In this embodiment, TFE tube 120 has a nominal internal diameter of approximately 0.059 inch, a wall thickness of 0.006 inch±0.002 inch, and a length of twenty feet. Before it is installed in vessel 117, tube 120 is thoroughly cleaned and dried, for example, by flushing it with deionized water at 15 psig, cleaning it with nitrogen for one minute, flushing it with 0.99999999 metals purity solvent for 5 minutes, drying it with warm nitrogen (>4 Standard Liters per Minute) for 30 minutes and immediately sealing tube 120 in a dry nitrogen environment.

As shown in FIG. 3, degas module 115 is provided with a float device 329 to alarm the user on detection of leakage of liquid 113 within degas module 115. Float device 329 may be any device well known in the industry (such as LCS-M100-SS available from Fluid Products Co., Inc., 14590 Martin Drive, Eden Prairie, Minn. 55344). Other devices may be used for detecting leaks; for example, an optical device which senses changes in reflectivity, or a pressure sensor which detects the vapor pressure of leaking liquid 113.

Outlet 119 and inlet 116 of vessel 117 may consist of any commercially available fittings for providing a gas, liquid and vacuum tight seal. In this embodiment, degas module 115's outlet and inlet are identical and each consists of Cajon VCR fittings for connections outside degas module 115 and Cajon Ultra-Torr fittings for connections inside degas module 115. Cajon VCR and Ultra-Torr fittings are available from Cajon Company, 9769 Shepard Road, Macedonia, Ohio 44056. Cajon VCR fittings outside degas module 115 provide a gas, liquid and vacuum tight seal via a metal gasket. Fittings inside degas module 115 (shown in FIG. 4) consist of stainless steel 1/16 inch Cajon Ultra-Torr fittings 400. A stainless steel sleeve 430 resides snugly inside an end of tube 120. Stainless steel sleeve 430 may have an 1/16 inch outer diameter and 3/4 inch length. External to tube 120 is an internal member 450 adjacent to an O-ring 410, both of which are resident inside a female fitting 440. Female fitting 440 along with internal member 450 and O-ring 410 mates with male fitting 460 in such a way that O-ring 410 is compressed on to tube 120 when the fitting is tightened, thus forming an air-tight seal. Male fitting 460 is welded to degas module cover 225 and connects to the Cajon VCR fitting external to degas module 115.

During operation, liquid 113 is displaced in supply source 112 by the pressurized helium. Liquid TEOS then flows through tube 120 of degas module 115 at a pressure higher than the low pressure surrounding tube 120. Since the fluoro-polymer walls of tube 120 are permeable to helium dissolved in the TEOS liquid, and since there is a pressure differential across the walls of tube 120, the helium gas diffuses out of the TEOS liquid, through the tube walls and into vessel 117. The helium in vessel 117 is then pumped away through low pressure connection 118. The TEOS liquid then flows into liquid mass flow controller 122 where it is precisely metered and controlled due to the absence of bubbles of helium. The outlet of liquid mass flow controller 122 can be connected to the inlet of a PECVD system to perform wafer depositions of precisely controlled and reproducible thickness.

In the preferred embodiment, if there is a rupture in tube 120, liquid collecting in vessel 117 triggers float device 329 which in turn alarms the user.

The liquid delivery system of this invention is simple, precise and relatively inexpensive. The system permits delivery of a liquid at a uniform pressure for a user specified flow rate. Static gas pressure displacement is a very economical and particle-free method of pressurizing liquids. Liquid flow in a system according to this invention is stable and uninterrupted until the supply source vessel is almost empty. Since the liquid being delivered is particle-free and without any dissolved gas after leaving the degas module, the liquid can be metered very precisely by the liquid mass flow controller.

The description of an embodiment of this invention is intended to be illustrative and not limiting. Numerous other embodiments will be apparent to those skilled in the art, all of which are included within the broad scope of this invention. The materials in this invention are not limited to those discussed in reference to the preferred embodiment. For example, the liquid could be any organometallic liquid such as tri-methyl-phosphite, tri-methyl-borate, tri-ethyl-phosphite, tri-ethyl-borate, or tetrakis(diethyl) aminotitanium. The pressurizing gas could be any gas inert to the liquid. For example, the pressurizing gas could be nitrogen, neon, argon, carbon-dioxide or oxygen. The tube could be made of any material permeable to the pressurizing gas and impermeable to the liquid. For example, the tube could consist of PTFE, PFA, polyethylene, polypropylene, PVDF or Nylon 6.

Furthermore, the apparatus and method according to this invention are not confined to PECVD systems, and can be used in any application that requires precise liquid delivery.

We claim:

1. A method of dispensing a liquid through a vaporizer within a chemical vapor deposition reactor, said method comprising the steps of:

subjecting said liquid to a pressurized gas in a supply vessel so as to force said liquid through a liquid outlet of said supply vessel, some of said pressurized gas thereby becoming dissolved in said liquid;

removing at least some of said dissolved gas from said liquid by passing said liquid through a gas permeable structure subjected to a pressure differential;

passing said liquid through a liquid mass flow controller, said step of removing at least some of said dissolved gas inhibiting formation of bubbles of said gas and thereby improving the accuracy of said liquid mass flow controller;

passing said liquid to said vaporizer within said chemical vapor deposition reactor; and dispensing said liquid through said vaporizer.

2. The method of claim 1 wherein said structure comprises a fluoro-polymer resin.

3. The method of claim 1 wherein said liquid comprises an organometallic liquid.

4. The method of claim 1 wherein said liquid is selected from the group consisting of tetra-ethyl-ortho-silicate, tri-methyl-phosphite, tri-methyl-borate, tri-ethyl-phosphite, tri-ethyl-borate, and tetrakis(diethyl)aminotitanium.

5. The method of claim 1 wherein said gas comprises an inert gas.

6. The method of claim 1 wherein said gas is selected from the group consisting of helium, nitrogen, neon, argon, carbon-dioxide and oxygen.

7. A method of dispensing a liquid through a vaporizer coupled to a chemical vapor deposition reactor, said method comprising the steps of:

subjecting said liquid to a pressurized gas in a supply vessel so as to force said liquid through a liquid outlet of said supply vessel, some of said pressurized gas thereby becoming dissolved in said liquid;

removing at least some of said dissolved gas from said liquid by passing said liquid through a gas permeable structure subjected to a pressure differential;

passing said liquid through a liquid mass flow controller, said step of removing at lest some of said dissolved gas inhibiting formation of bubbles of said gas and thereby improving the accuracy of said liquid mass flow controller;

passing said liquid to said vaporizer coupled to said chemical vapor deposition reactor; and dispensing said liquid through said vaporizer.

8. The method of claim 7 wherein said structure comprises a fluoro-polymer resin.

9. The method of claim 7 wherein said liquid comprises an organometallic liquid.

10. The method of claim 7 wherein said liquid is selected from the group consisting of tetra-ethyl-ortho-silicate, tri-methyl-phosphite, tri-methyl-borate, tri-ethyl-phosphite, tri-ethyl-borate, and tetrakis(diethyl)aminotitanium.

11. The method of claim 7 wherein said gas comprises an inert gas.

12. The method of claim 7 wherein said gas is selected from the group consisting of helium nitrogen, neon, argon, carbon-dioxide and oxygen.

13. A method of dispensing a liquid through a vaporizer, said method comprising the steps of:

subjecting said liquid to a pressurized gas in a supply vessel so as to force said liquid through a liquid outlet of said supply vessel, some of said pressurized gas thereby becoming dissolved in said liquid;

removing at least some of said dissolved gas from said liquid by passing said liquid through a gas permeable structure subjected to a pressure differential;

passing said liquid through a liquid mass flow controller, said step of removing at least some of said dissolved gas inhibiting formation of bubbles of said gas and thereby improving the accuracy of said liquid mass flow controller;

passing said liquid to said vaporizer; and dispensing said liquid through said vaporizer.

14. The method of claim 13 wherein said gas permeable structure comprises a coiled tube and said step of removing comprises passing said liquid through said coiled tube.

15. A liquid delivery system for a chemical vapor deposition reactor comprising:

a supply source comprising a first vessel for containing said liquid, said first vessel comprising a gas inlet and a liquid outlet, wherein said gas inlet is connected to a source of pressurized gas, said first vessel comprising an interface between said liquid and said pressurized gas, said pressurized gas acting on said interface so as to force said liquid through said liquid outlet of said first vessel, some of said gas thereby becoming dissolved in said liquid;

a liquid mass flow controller comprising an inlet and an outlet;

a chemical vapor deposition reactor with a vaporizer resident inside said reactor, said reactor having an inlet connected internally to said vaporizer and externally to said outlet of said liquid mass flow controller, said liquid mass flow controller dispensing said liquid in a precisely metered manner at a uniform pressure to said chemical vapor deposition reactor; and a degas module comprising:

a second vessel comprising a low pressure connection, an inlet and an outlet, wherein said low pressure connection is connected to a low pressure source, said inlet of said second vessel is connected to said liquid outlet of said supply source, and said outlet of said second vessel is connected to said inlet of said liquid mass flow controller, and a structure comprising a material impermeable to said liquid and permeable to said gas, said structure being resident inside said second vessel, said structure having an inlet and an outlet, said inlet of said structure being in flow communication with said inlet of said second vessel and said outlet of said structure being in flow communication with said outlet of said second vessel, said degas module removing at least some of said dissolved gas from said liquid so as to inhibit formation of bubbles of said gas in said liquid in said mass flow controller and thereby improve the accuracy of said liquid mass flow controller.

16. The system of claim 15 wherein said liquid comprises an organometallic liquid.

17. The system of claim 15 wherein said liquid is selected from the group consisting of tetra-ethyl-ortho-silicate, tri-methyl-phosphite, tri-methyl-borate, tri-ethyl-phosphate, tri-ethyl-borate, and tetrakis(diethyl)aminotitanium.

18. The system of claim 15 wherein said gas comprises an inert gas.

19. The system of claim 15 wherein said gas is selected from the group consisting of helium, nitrogen, neon, argon, carbon-dioxide and oxygen.

20. The liquid delivery system of claim 15 wherein said structure comprises a coiled tube.

21. A liquid delivery system for a chemical vapor deposition reactor comprising:

a supply source comprising a first vessel for containing said liquid, said first vessel comprising a gas inlet and a liquid outlet, wherein said gas inlet is connected to a source of pressurized gas, said first vessel comprising an interface between said liquid and said pressurized gas, said pressurized gas acting on said interface so as to force said liquid through said liquid outlet of said first vessel, some of said gas thereby becoming dissolved in said liquid;

a liquid mass flow controller comprising an inlet and an outlet;

a chemical vapor deposition reactor and a vaporizer coupled to said reactor, said vaporizer being coupled to said outlet of said liquid mass flow controller, said liquid mass flow controller dispensing said liquid in a precisely metered manner at a uniform pressure to said chemical vapor deposition reactor; and a degas module comprising:
 a second vessel comprising a low pressure connection, an inlet and an outlet, wherein said low pressure connection is connected to a low pressure source, said inlet of said second vessel is connected to said liquid outlet of said supply source, and said outlet of said second vessel is connected to said inlet of said liquid mass flow controller, and
 a structure comprising a material impermeable to said liquid and permeable to said gas, said structure being resident inside said second vessel, said structure having an inlet and an outlet, said inlet of said structure being in flow communication with said inlet of said second vessel and said outlet of said structure being in flow communication with said outlet of said second vessel, said degas module removing at least some of said dissolved Was from said liquid so as to inhibit formation of bubbles of said gas in said liquid in said mass flow controller and thereby improve the accuracy of said liquid mass flow controller.

22. The system of claim 21 wherein said liquid comprises an organometallic liquid.

23. The system of claim 21 wherein said liquid is selected from the group consisting of tetra-ethyl-ortho-silicate, tri-methyl-phosphite, tri-methyl-borate, tri-ethyl-phosphite, tri-ethyl-borate, and tetrakis(diethyl)aminotitanium.

24. The system of claim 21 wherein said gas comprises an inert gas.

25. The system of claim 21 wherein said gas is selected from the group consisting of helium, nitrogen, neon, argon, carbon-dioxide and oxygen.

26. The system of claim 21 wherein said structure comprises a tube.

27. The system of claim 26 wherein said tube is coiled.

28. A liquid delivery system for dispensing a liquid through a vaporizer, said system comprising:
 a supply source comprising a first vessel for containing said liquid, said first vessel comprising a gas inlet and a liquid outlet, wherein said gas inlet is connected to a source of pressurized gas, said first vessel comprising an interface between said liquid and said pressurized gas, said pressurized gas acting on said interface so as to force said liquid through said liquid outlet of said first vessel, some of said gas thereby becoming dissolved in said liquid;
 a liquid mass flow controller comprising an inlet and an outlet;
 a vaporizer coupled to said outlet of said liquid mass flow controller, said liquid mass flow controller dispensing said liquid in a precisely metered manner at a uniform pressure to said vaporizer; and
 a degas module comprising:
  a second vessel comprising a low pressure connection, an inlet and an outlet,
   wherein said low pressure connection is couplable to a low pressure source, said inlet of said second vessel is coupled to said liquid outlet of said supply source, and said outlet of said second vessel is coupled to said inlet of said liquid mass flow controller, and a structure comprising a material impermeable to said liquid and permeable to said gas, said structure being resident inside said second vessel;
wherein said degas module uses said structure to remove at least some of said dissolved gas from said liquid so as to inhibit formation of bubbles of said gas in said liquid in said mass flow controller and thereby improve the accuracy of said liquid mass flow controller during dispensing of said liquid to said vaporizer.

29. The system of claim 28 wherein said structure comprises a coiled tube.

* * * * *

UNITED STATES PATENT AND TRADEMARK OFFICE
CERTIFICATE OF CORRECTION

PATENT NO. : 5,645,625
DATED : July 8, 1997
INVENTOR(S) : van Schravendijk, Bart J.; Burkhart, Christopher W.; Santiago, Tito H.; Pomeroy, Charles E.; Lind, Jeffrey W.

It is certified that error appears in the above-indentified patent and that said Letters Patent is hereby corrected as shown below:

In column 5, line 36, delete "lest" and insert -- least --.

Signed and Sealed this

Seventh Day of July, 1998

Attest:

BRUCE LEHMAN

Attesting Officer     Commissioner of Patents and Trademarks